(12) United States Patent
Hayashi

(10) Patent No.: US 6,438,440 B1
(45) Date of Patent: Aug. 20, 2002

(54) METHOD AND SYSTEM FOR MANAGING SEMICONDUCTOR MANUFACTURING EQUIPMENT

(75) Inventor: Shunji Hayashi, Miyazaki (JP)

(73) Assignee: Oki Electirc Industry Co., Ltd., Tokyo (JP)

( * ) Notice: Subject to any disclaimer, the term of this patent is extended or adjusted under 35 U.S.C. 154(b) by 0 days.

(21) Appl. No.: 09/276,804

(22) Filed: Mar. 26, 1999

(30) Foreign Application Priority Data

Sep. 30, 1998 (JP) ............................................. 10-277043

(51) Int. Cl.$^7$ .............................................. G06F 19/00

(52) U.S. Cl. .......................... 700/121; 700/32; 700/108; 700/117; 700/78; 700/79; 702/28; 702/84; 702/85; 702/185; 382/118; 382/115; 382/278; 382/309

(58) Field of Search ............................... 700/73–74, 96, 700/108, 78–80, 111, 117, 121, 21–22, 28, 32; 702/28–32, 82–85, 84, 184–185; 318/561, 560; 382/149, 155–159, 278, 190–197, 118, 309, 115, 227

(56) References Cited

U.S. PATENT DOCUMENTS

| | | | | |
|---|---|---|---|---|
| 5,446,681 A | * | 8/1995 | Gethner et al. | 382/149 |
| 5,586,066 A | * | 12/1996 | White et al. | 702/181 |
| 5,590,036 A | * | 12/1996 | Maeda | 700/79 |
| 5,602,938 A | * | 2/1997 | Akiyama et al. | 382/155 |
| 5,726,905 A | * | 3/1998 | Yazici et al. | 702/38 |
| 5,742,522 A | * | 4/1998 | Yazici et al. | 704/241 |
| 5,751,898 A | * | 5/1998 | Kosaka et al. | 702/185 |
| 6,012,019 A | * | 1/2000 | Saby | 702/32 |
| 6,272,233 B1 | * | 8/2001 | Takeo | 382/128 |

* cited by examiner

Primary Examiner—Ramesh Patel
(74) Attorney, Agent, or Firm—Volentine Francos, PLLC

(57) ABSTRACT

A management method capable of making an accurate decision about a malfunction of the semiconductor manufacturing equipment includes sampling a plurality of data of at least one parameter under normal operating conditions of the semiconductor manufacturing equipment; generating a Mahalanobis space A from a group of sampled data; calculating a Mahalanobis distance $D^2$ from measured values of the parameter under ordinary operating conditions of the semiconductor manufacturing equipment; and deciding that a malfunction occurred in the semiconductor manufacturing equipment when the value of the Mahalanobis distance exceeds a predetermined value.

8 Claims, 11 Drawing Sheets

GRAPH SHOWING CHANGES IN MAHALANOBIS DISTANCE IN SECOND EMBODIMENT

CHANGE IN PLASMA EMISSION INTENSITY

| N | $Y'_1$ | $Y'_2$ | .... | $Y'_n$ |
|---|---|---|---|---|
| 1 | $y'_{1\cdot 1}$ | $y'_{2\cdot 1}$ | .... | $y'_{n\cdot 1}$ |
| 2 | $y'_{1\cdot 2}$ | $y'_{2\cdot 2}$ | .... | $y'_{n\cdot 2}$ |
| ⋮ | ⋮ | ⋮ | ⋮ | ⋮ |
| m | $y'_{1\cdot m}$ | $y'_{2\cdot m}$ | .... | $y'_{n\cdot m}$ |

(a) MEASURED DATA

| N | $Y_1$ | $Y_2$ | .... | $Y_n$ |
|---|---|---|---|---|
| 1 | $y_{1\cdot 1}$ | $y_{2\cdot 1}$ | .... | $y_{n\cdot 1}$ |
| 2 | $y_{1\cdot 2}$ | $y_{2\cdot 2}$ | .... | $y_{n\cdot 2}$ |
| ⋮ | ⋮ | ⋮ | ⋮ | ⋮ |
| m | $y_{1\cdot m}$ | $y_{2\cdot m}$ | .... | $y_{n\cdot m}$ |

(b) STANDARDIZED DATA

STANDARDIZATION OF DATA

FIG. 4

$$R = \begin{bmatrix} 1 & r_{1\cdot 2} & \cdots & r_{1\cdot n} \\ r_{2\cdot 1} & 1 & \cdots & r_{2\cdot n} \\ & & r_{i\cdot j} & \\ \vdots & \vdots & \cdots & \vdots \\ r_{n\cdot 1} & r_{n\cdot 2} & \cdots & 1 \end{bmatrix}$$

WHEREIN,
$$r_{i\cdot j} = r_{j\cdot i} = \frac{1}{m} \sum_{p=1}^{m} y_{i\cdot p}\, y_{j\cdot p} \quad \cdots (2)$$

(a) CORRELATION MATRIX R (i, j=1∼n)

$$A = R^{-1} = \begin{bmatrix} a_{1\cdot 1} & a_{1\cdot 2} & \cdots & a_{1\cdot n} \\ a_{2\cdot 1} & a_{2\cdot 2} & \cdots & a_{2\cdot n} \\ & & a_{i\cdot j} & \\ \vdots & \vdots & \cdots & \vdots \\ a_{n\cdot 1} & a_{n\cdot 2} & \cdots & a_{n\cdot n} \end{bmatrix}$$

(b) INVERSE MATRIX OF CORRELATION MATRIX R (i, j=1∼n)

$$D^2 = \frac{1}{n} \sum_{i=1}^{n} \sum_{j=1}^{n} a_{i\cdot j}\, y_i\, y_j \quad \cdots (3)$$

(c) MAHALANOBIS (SQUARED) DISTANCE $D^2$

DATA PROCESSING

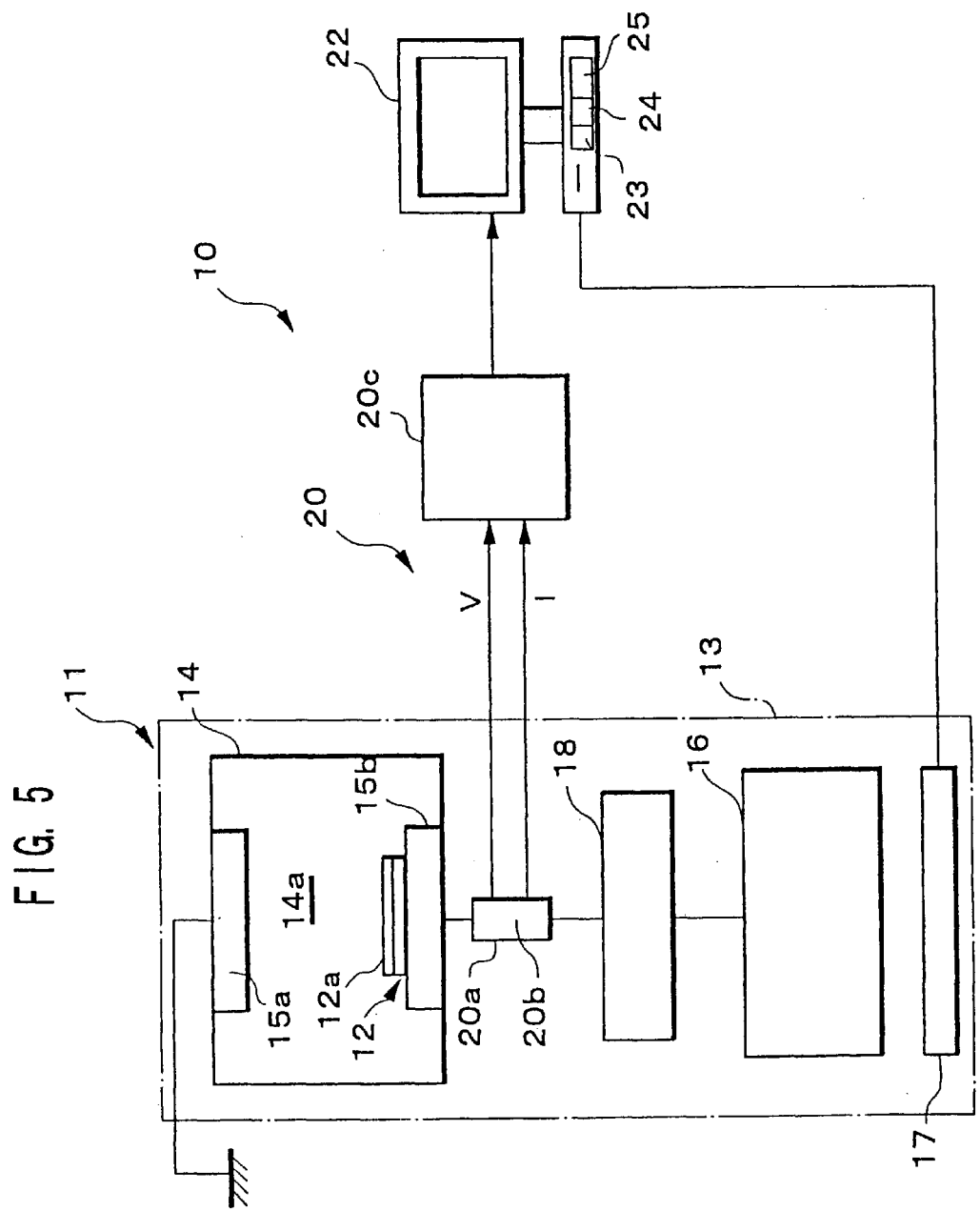

FIG. 6

| | Time. 1 | Time. 2 | Time. 3 | ...... n |
|---|---|---|---|---|
| | IO.., VO..,Θ | IO.., VO..,Θ | IO.., VO..,Θ | ......Θ |
| 1 | X1,......,X11 | X12,......,X22 | X23,......,X33 | ......Xnn |
| 2 | Y1,......,Y11 | Y12,......,Y22 | Y23,......,Y33 | ......Ynn |

STANDARDIZED DATA IN SECOND EMBODIMENT

GRAPH (PART1) SHOWING CHANGES IN MEASURED DATA

GRAPH (PART2) SHOWING CHANGES IN MEASURED DATA

GRAPH (PART3) SHOWING CHANGES IN MEASURED DATA

GRAPH (PART4) SHOWING CHANGES IN MEASURED DATA

FIG. 13

| | Time. 1 | Time. 2 | Time. 3 | ... | Time. n |
|---|---|---|---|---|---|
| | λ1,...., λ11 | λ1,...., λ11 | λ1,...., λ11 | ... | ...., λ11 |
| 1 | X1,...., X11 | X12,....,X22 | X23,....,X33 | ...... | Xnn |
| 2 | Y1,...., Y11 | Y12,....,Y22 | Y23,....,Y33 | ...... | Ynn |

STANDARDIZED DATA IN THIRD EMBODIMENT

GRAPH SHOWING CHANGES IN PLASMA EMISSION INTENSITY

GRAPH SHOWING CHANGES IN MAHALANOBIS DISTANCE IN THIRD EMBODIMENT

METHOD AND SYSTEM FOR MANAGING SEMICONDUCTOR MANUFACTURING EQUIPMENT

BACKGROUND OF THE INVENTION

1. Field of the Invention

The present invention relates to a method and a system for managing semiconductor manufacturing equipment.

2. Related Art

In management systems for manufacturing equipment, such as semiconductor manufacturing equipment, to decide whether or not the manufacturing equipment is operating normally, an interlock system is generally adopted which detects data on a parameter such as the temperature or pressure of the functional part of the manufacturing equipment, and stops the operation of the manufacturing equipment when the data indicates an abnormal value.

According to this interlock system, it is possible to immediately stop the operation of the manufacturing equipment when an abnormal data value is detected, and thereby minimize the ejection of nonconforming products.

However, in a conventional interlock system such as mentioned above, when the etching steps from beginning to end of etching work on a plasma etching system are controlled according to changes in the plasma emission intensity, the plasma emission intensity varies greatly from beginning to end of the etching process, so that the plasma emission intensity cannot be used as a parameter to detect a malfunction of the equipment.

In the interlock system, only one decision is made whether or not data values of a single parameter exceed a predetermined range, and it is impossible to capture time-series changes between data values. Therefore, it is not easy to catch a malfunction accurately.

Further, in the interlock system, even if a plurality of parameters are combined, it is hard to give correlation between the parameters, and it is difficult to catch a malfunction accurately.

SUMMARY OF THE INVENTION

The object of the present invention is to provide a management method and a management system capable of making a correct decision about a malfunction of the semiconductor manufacturing equipment.

According to the present invention, there is provided a method of managing the operation of semiconductor manufacturing equipment, comprising sampling a plurality of data of at least one parameter under the normal operating condition of the semiconductor manufacturing equipment, generating a Mahalanobis space from a group of sampled data, calculating a Mahalanobis distance from a group of measured values of the parameters, obtained under the operating condition of the semiconductor manufacturing equipment by using the Mahalanobis space, and when the Mahalanobis distance exceeds a predetermined value, making a decision that a malfunction occurred in the semiconductor manufacturing equipment.

In the management method according to the present invention, a Mahalanobis space based on a data group including a plurality of data is formed, and by using this Mahalanobis space, a Mahalanobis distance is calculated from measured values of the parameter, obtained in the operating condition of the semiconductor manufacturing equipment, and according to the values of the Mahalanobis distance, a decision is made whether the semiconductor manufacturing equipment is operating normally or abnormally.

The above-mentioned Mahalanobis space is expressed by an inverse matrix of a correlation matrix derived from an aggregate of data to be described later. Therefore, by using a Mahalanobis space, even though a single parameter is adopted, a data group is not handled as separate data values in the Mahalanobis space, and a correlation among data is taken into consideration.

Consequently, according to the management method of the present invention, a decision can be made whether the operating condition of the semiconductor manufacturing equipment is normal or not with high accuracy not obtainable in the prior-art interlock system, in which the correlation among data is not considered. For this reason, the operation of the semiconductor manufacturing equipment can be managed with much higher accuracy than in the prior art.

Further, a plurality of parameters other than said at least one parameter are provided. Mahalanobis spaces under abnormal conditions are formed previously, each abnormal condition being generated by setting one of said parameters at an abnormal value and other said parameters at normal values. When, from a value of said Mahalanobis distance, a decision has been made that a malfunction occurred, Mahalanobis distances corresponding to Mahalanobis spaces are calculated from said measured values by using said Mahalanobis space under the abnormal condition. And, it can be estimated that among said plurality of parameters, abnormality occurred in a parameter that gave a Mahalanobis space such that said Mahalanobis distance is closest to 1.

Among the Mahalanobis distances calculated on the basis of the respective Mahalanobis spaces, the Mahalanobis distance, which was calculated by using a Mahalanobis space under a condition closest to the present condition that gave a measured value, is closest to 1.

Therefore, among a plurality of Mahalanobis spaces used for calculating said Mahalanobis distances, a Mahalanobis space that brought forth a Mahalanobis distance closest to the value 1 can be regarded as the Mahalanobis space under a condition closest to the condition that brought forth the measured values. Accordingly, it can be estimated that the cause of abnormality lies in the abnormality detection parameter that brought about a Mahalanobis space that produces a Mahalanobis distance closest to the value 1.

The above-mentioned at least one parameter can be composed of a plurality of mutually different parameters. Therefore, Mahalanobis spaces can be formed at predetermined times from a data group of said plurality of parameters measured at predetermined times. Therefore, by using said Mahalanobis spaces formed at predetermined times, Mahalanobis distances at predetermined times can be calculated from a group of measured values of the plurality of parameters, obtained from the operating condition of the semiconductor manufacturing equipment.

According to the present invention, there is provided a management system of semiconductor manufacturing equipment comprising:

a memory unit for storing data on a Mahalanobis space obtained from a parameter showing a normal operating condition of semiconductor manufacturing equipment;

a detection mechanism for obtaining data values of said parameter from said semiconductor manufacturing equipment in operation;

an arithmetic circuit for calculating a Mahalanobis distance from a data group of said parameter, obtained by said detection mechanism by using said Mahalanobis space stored in said memory unit; and a circuit for deciding whether or not a calculated value of said Mahalanobis distance by said arithmetic circuit exceeds a predetermined value.

According to the present invention, the arithmetic circuit calculates a Mahalanobis distance from parameter values obtained by the detection mechanism on the basis of a Mahalanobis space stored in the memory unit, and the decision circuit decides whether or not the calculated Mahalanobis distance exceeds a predetermined value. Therefore, the method according to the present invention can be put into quick and effective use.

The management system according to the present invention can be applied to management of the plasma etching system. As a detection mechanism for detecting plasma emission intensity of the plasma etching system, it is possible to use a detection mechanism with a plasma emission intensity detector that measures the intensity of a desired wavelength of plasma emission of the etching system.

From data on plasma emission intensity detected by the plasma emission intensity detector, it is possible to obtain the above-mentioned Mahalanobis space and Mahalanobis distance. By decision made by using the Mahalanobis distance, it is possible to decide with high accuracy whether the plasma etching system has operated normally or not.

The above-mentioned detection mechanism may be a detection mechanism including a voltage detector and a current detector for obtaining a current value, a voltage value, and a phase of high frequency output of a high frequency transmitter installed in the plasma etching system. By using this detection mechanism, in other words, by using data on the voltage value, the current value and the phase, the above-mentioned Mahalanobis space and Mahalanobis distance can be obtained. By a decision made by using the Mahalanobis distance, it is possible to decide with high accuracy whether the plasma etching system has operated normally or not.

The above-mentioned detection mechanism can further include a data converter for obtaining current values, voltage values and a phase from the fundamental wave and harmonics of the high frequency output from a current value and a voltage value detected by the current detector and the voltage detector. Therefore, on the basis of data of a plurality of parameters, such as the current values, voltage values and the phases of the fundamental wave and the harmonics at predetermined times, Mahalanobis spaces can be generated at the predetermined times. Thus, by using the Mahalanobis spaces at the predetermined times, Mahalanobis distances can be calculated from measured values of the plurality of parameters, obtained under operating condition of the etching system.

Therefore, by converting the operating condition of the etching system into time-series changes between data values by making a decision about the Mahalanobis distance generated in time series, the operating condition of the etching system can be managed suitably in time series according to the correlation among the parameters.

As the detection mechanism of the etching system, a detection mechanism with an emission spectrometer may be used to measure the intensity of a plurality of desired wavelengths of plasma emission.

The emission spectrometer, being capable of measuring the intensity of a plurality of desired wavelengths, can handle the different degrees of intensity of the plurality of wavelengths of plasma emission as parameters. Therefore, it becomes possible to suitably manage the operating condition of the etching system by time series control according to the correlation between the different degrees of intensity of different wavelengths of plasma emission.

BRIEF DESCRIPTION OF THE DRAWINGS

FIG. 4 is an explanatory diagram showing a data processing method for obtaining Mahalanobis spaces;

FIG. 5 is a diagram, like in FIG. 1, schematically showing another example of the management system of semiconductor manufacturing equipment according to the present invention;

FIG. 6 is an explanatory diagram showing a data group on a plurality of parameters detected by the detection mechanism of the management system in FIG. 5;

FIG. 13 is an explanatory diagram showing the data group on a plurality of parameters detetected by the detection mechanism in FIG. 9;

DESCRIPTION OF THE PREFERRED EMBODIMENTS

<Embodiment 1>

Figure 1:
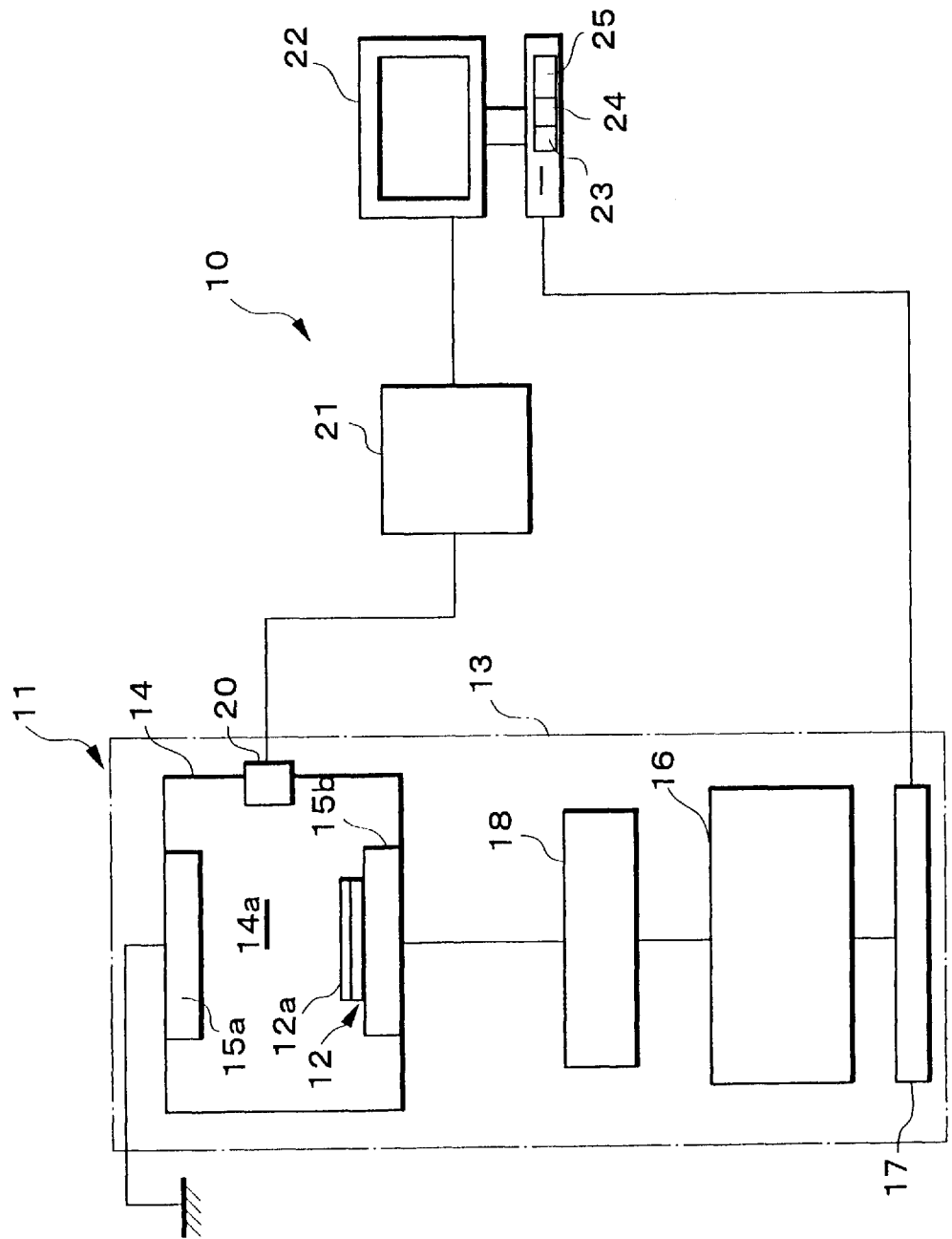
FIG. 1 is a block diagram schematically showing a management system of semiconductor manufacturing equipment according to the present invention.

FIG. 1 shows an example of application of the management system of the present invention to a plasma etching system as one of semiconductor manufacturing equipment.

As has been well known, a plasma etching system 11, to which a management system 10 of the present invention is applied, is used to perform dry etching, for example, to bore contact holes in a top layer 12a, such as an insulating film, formed on a semiconductor substrate 12, such as a semiconductor wafer.

The plasma etching system 11, as shown in FIG. 1, includes a housing 13, a reactor 14 for preserving plasma, accommodated in the housing, a couple of electrodes 15 (15a and 15b) arranged spaced apart from each other in a reaction chamber 14a defined in the reactor 14, a high frequency generator 16 as a high frequency source to produce plasma, and a controller 17 to control the operation of the units, including the high frequency generator 16 of the plasma etching system 11.

One electrode 15a is connected to earth ground, while the other electrode receives high-frequency output from the high frequency generator 16 through an impedance matching box 18.

A semiconductor substrate 12 is arranged, with the top layer 12a facing up for processing, on the electrode 12b that receives output from the high frequency generator 16. As is well known, a selective etching mask is attached when necessary to the surface 12a, which is processed, of the semiconductor substrate 12.

A reaction gas, such as $CF_4$, is guided to the reaction chamber 14a of the reactor 14 through a well-known gas supply system, not shown, and the gas is discharged regularly through an exhaust system to maintain the atmosphere in the reaction chamber 14a at a desired gas pressure.

In the plasma etching system 11, as is well known, by the operation of the controller 17, when high-frequency electric power is output from the high frequency generator 16 to the other electrode 15b, plasma, containing active molecules and atoms called radicals, is formed by glow discharge between the electrodes 15a and 15b, and by chemical reactions of radicals, the top layer 12a of the semiconductor substrate 12 is etched. RIE (reactive ion etching) may be applied preferably.

At this time, the plasma emission varies with the progress of etching. In other words, the intensity of light of a desired wavelength, which increases with the progress of etching of the top layer 12a as an insulating layer different in material from the semiconductor layer 12, drops when the etching action extends to the semiconductor substrate 12 under the top layer 12a.

Figures 2, 3:
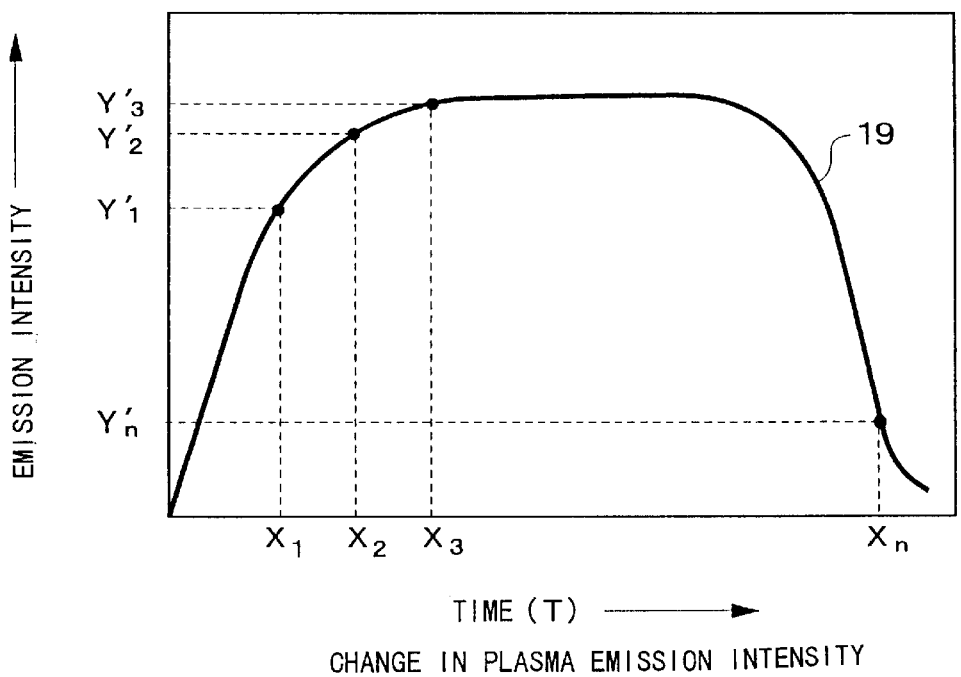
FIG. 2 is a graph of light intensity showing an example of changes in data detected by the detection mechanism of the management system depicted in FIG. 1.
FIG. 3 is an explanatory diagram showing data for obtaining Mahalanobis spaces used in the management system in FIG. 1.

The changes in light intensity are shown in the graph of FIG. 2.

The horizontal axis of FIG. 2 represents time (in seconds) from the start of etching, and the vertical axis represents the light intensity by plasma emission in the reaction chamber 14a in the etching process.

The characteristic curve 19 of FIG. 2 shows the changes in light intensity of a given wavelength by plasma emission. As indicated by this characteristic curve 19, the intensity of plasma emission caused by etching of the top layer, which started at time 0, increases to $Y'_1$, $Y'_2$, then to $Y'_3$, with the progress of etching as time passes through $X_1$, $X_2$ and $X_3$.

When the plasma emission intensity is almost saturated ($Y'_3$) at time $X_3$, the emission intensity decreases with decrease in the thickness of the top layer 12a, and the emission intensity falls below a given value $Y'_n$, at time $X_n$.

At this time, a decision can be made that etching has reached the semiconductor substrate 12, and from this it can be known that required etching has ended for contact holes that pass through the top layer 12a.

The management system by which to detect the end of the etching process by observing a light of a desired wavelength in plasma emission is known as the EPD (End Point Detect) system.

The management system 10 according to the present invention is capable of detecting whether or not a plasma etching system 11 operated normally by observing a light of a desired wave in plasma emission.

Again referring to FIG. 1, the management system includes a light sensor 20, installed in the reaction chamber 14a, for detecting a light intensity of a desired wavelength in plasma emission in the reaction chamber 14a; and an information processing unit 22 for receiving a signal detected by the light sensor 20 through a monitor 21 and processing data of the signal.

The plasma emission shows a peak value in a desired range of wavelengths, though the range differs with the active gas in the reaction chamber 14a, the top layer 12a to be etched, or other operating conditions. The light sensor 20, provided as a light intensity detector of the light detection mechanism, includes a filter or a monochrometer for receiving light of the desired wavelength range, and thereby converts the light intensity of the desired wavelength range into an electric signal, and sends it to the monitor 21.

On receiving an electric signal from the light sensor 20 as a plasma emission intensity detector, the monitor 21 detects a finish time of etching from observation of the emission intensity as has been described with reference to FIG. 2. The monitor 21 sends the electric signal from the light sensor 20 to the information-processing unit 22.

The information-processing unit 22 comprises a computer in the example shown in FIG. 2. The computer 22 includes a memory unit 23 for storing data on Mahalanobis space to be described later, an arithmetic circuit 24 for arithmetic operation of data represented by a parameter signal of light intensity detected by the light sensor 20 as a light intensity detector, and a comparator 25.

The arithmetic circuit 24 and the comparator circuit 25 should preferably be realized by software to achieve a desired arithmetic function, which will be described later.

Before the management system 10 according to the present invention is put into operation, a Mahalanobis space under normal operating condition of the plasma etching system is generated.

To form this Mahalanobis space, the light sensor 20 detects the intensity of a desired wavelength in plasma emission in the process of forming etched holes.

By intensity detection by the light sensor 20, data on respective degrees of emission intensity ($Y'_1$, $Y'_2$, $Y'_3$, ... $Y'_n$) is sampled at times ($X_1$, $X_2$, $X_3$, ... $X_n$) shown in FIG. 2 in the process of forming etched holes in the top layer on a piece of semiconductor substrate 12.

Under normal operating condition, sampling is further done on data, same as mentioned above, in the process of forming etched holes with another semiconductor substrate 12. Consequently, with regard to a single parameter under normal operating condition, in other words, with regard to the intensity of a desired wavelength in plasma emission in this example, a data group can be obtained from etching processes carried out a plurality of times.

FIG. 3(a) shows a group of measured data obtained by sampling. Measured data is designated as $y'_{1.1} \ldots y'_{n.1}$ for respective degrees of emission intensity ($Y'_1$, $Y'_2$, $Y'_3$, ... $Y'_n$) in the etching process (1) on a given semiconductor substrate 12. Similar measured data of emission intensity is designated as $y'_{1.2} \ldots y'_{n.m}$ in an etching process (2 ... m) on another semiconductor substrate 12 as given below.

The measured data ($y'_{1.1}$ to $y'_{n.m}$) is standardized by using the following equation.

$$Y_{n.m} = (Y'_{n.m} - \text{Ave}_n)/\sigma_n \tag{1}$$

where $\text{Ave}_n$ is an average of each measured data at times ($X_1$, $X_2$, $X_3$ ... $X_n$). In other words, $\text{Ave}_1$ denotes an average of $y'_{1.1} \ldots y'_{1.m}$. Similarly, $\text{Ave}_n$ denotes $y'_{n.1} \ldots y'_{n.m}$. $\sigma_n$ denotes a standard deviation of data at different times.

FIG. 3(b) shows a group of standardized data obtained by standardizing the group of measured data shown in FIG. 3(a) by Eq.(1).

Arithmetic operations by Eq.(1) to obtain this group of standardized data can be performed by the arithmetic circuit 24 of the computer 22.

A correlation matrix R shown in FIG. 4(a) can be obtained from a group of standardized data presented in FIG. 3(b). The matrix elements $r_{i,j}$ and $r_{j,i}$ (i,j=1 to n) of the correlation matrix R can be expressed as functions of data $y_{i,j}$ and $y_{j,i}$ of the group of standardized data as shown in Eq.(2) of FIG. 4(a).

When the correlation matrix R is obtained from the group of standardized data, an inverse matrix A of the correlation matrix R, that is, a Mahalanobis space A (a base space A) under normal operating condition of the plasma etching system 11 can be obtained.

An arithmetic process to obtain this Mahalanobis space can be carried out entirely by the arithmetic circuit 24. The matrix elements $a_{i,j}$ (i,j=1 to n) of the inverse matrix A, or a Mahalanobis space A, are stored in the memory unit 23 of the computer 22.

After the Mahalanobis space A is obtained, when the plasma etching system 11 is put into an ordinary operation for etching of a semiconductor substrate 12, just as mentioned above, data on the intensity of a desired wavelength is sampled through the light sensor 20 from plasma emission in the reaction chamber 14a of the plasma etching system 11.

When a series of measured data $y'_1 \ldots y'_n$ is obtained by the finish of the etching process of the semiconductor substrate 12, the measured data undergoes the same standardization process as mentioned above by Eq.(1) using $Ave_n$ and $\sigma_n$, by which a series of standardized data $y_1 \ldots y_n$ same as shown in FIG. 3(b) can be obtained.

When a series of standardized data is obtained, a Mahalanobis distance $D^2$ can be obtained by execution of the arithmetic operation by Eq.(3) as shown in FIG. 4(c).

The $y_i$, $y_j$ shown in Eq.(3) are values obtained from standardized data $y_1 \ldots y_n$. On the other hand, $a_{i,j}$ is a matrix element of the previously obtained Mahalanobis space A.

The Mahalanobis distance $D^2$ obtained by the arithmetic circuit 24 comes to be a value closer to 1 when there is a higher similarity between a series of data $y_1 \ldots y_n$ as the basis for obtaining this distance and a group of base data $y_{1,1} \ldots y_{n,m}$ as the basis for obtaining the Mahalanobis space A.

In other words, so long as the Mahalanobis space A is generated by a data group under normal operating condition of the plasma etching system 11, the operating condition is closer to normal as the Mahalanobis distance $D^2$ is closer to 1. Conversely, the operating condition deviates more from being normal as the Mahalanobis distance $D^2$ becomes more remote from 1.

Therefore, according to a decision by the comparator circuit 25 as to whether or not the Mahalanobis distance $D^2$ is larger than a threshold value, it is possible to decide whether nor not the etching process that gave a series of data $y_1 \ldots y_n$ ended normally.

When the comparator circuit 25 makes a abnormality decision, alarm means, such as a sound generator or an indicator lamp, not shown, can be actuated. The computer 22 can send an operation stop signal to the controller 17 of the plasma etching system.

The threshold value mentioned above can be selected properly between 2 and 4, for example, according to strictness of control.

According to the control system 10 according to the present invention, a decision can be made for each etching process about whether or not the etching process took place normally by using information from the light sensor of the EPD (End Point Detect) system that observes plasma emission of the plasma etching system. Thus, it is possible to control the etching process properly.

An example of etching process control has been described. But, the management method according to the present invention can be applied to abnormality detection at a start-up operation after periodic inspection or after overhauling of the plasma etching system 11.

To obtain a Mahalanobis space A from a data group under normal operating condition at the start-up, an unprocessed silicon semiconductor substrate, for example, may be used as a dummy specimen instead of a semiconductor substrate 12.

A group of measured data, like those given in FIG. 3(a), on plasma emission is obtained by using this dummy specimen, from this group of measured data, a group of standardized data like those given in FIG. 3(b) is obtained, and from this group of standardized data, a Mahalanobis space under normal operating condition, like the one mentioned above, is obtained.

In a subsequent start-up operation, from standardized data obtained by standardizing measured data taken during the start-up operation, a Mahalanobis distance $D^2$ like the one mentioned above is obtained.

Therefore, from the value of this Mahalanobis distance $D^2$, a decision can be made whether or not the start-up operation took place normally.

In a case where a number of parameters are used, such as the pressure or the temperature in the reaction chamber 14a, or the high frequency output, Mahalanobis spaces (B, C, . . . ) can be previously generated under multiple abnormal conditions, each abnormal condition being set such that one of the parameters, the pressure for example, is set at an abnormal value, and the other parameters are set at normal ordinary values.

When a decision was made that the plasma etching system 11 is operating abnormally, by using a group of standardized data obtained under the operating condition judged abnormal and instead of the Mahalanobis space A, on the basis of Mahalanobis spaces (B, C . . . ) generated under mutually different abnormal operating conditions, each abnormal operating condition having one parameter set at an abnormal value and the other parameters set at normal values, Mahalanobis distances $D^2$ are obtained for the respective Mahalanobis spaces.

A Mahalanobis space (B, C . . . ) that gives the Mahalanobis distance that is closest to 1 among all those Mahalanobis distances is considered to be under an operating condition closest to the operating condition judged abnormal.

Therefore, it is possible to estimate that abnormality would have occurred in the abnormal parameter used to derive the Mahalanobis space (B, C . . . ) that gives the Mahalanobis distance $D^2$ closest to 1. In other words, when the Mahalanobis distance calculated on the basis of a Mahalanobis space by setting the high frequency output at an abnormal value is closest to 1, the abnormal operating condition that gave the group of standardized data can be assumed which is attributable to abnormality in the high frequency output.

Therefore, the cause of abnormality can be assumed by comparing Mahalanobis distances $D^2$ by using a Mahalanobis space under an abnormal parameter.

<Embodiment 2>

In the plasma etching systems, the high frequency output supplied to the electrode 15b from the high frequency generator 16 is highly responsive to changes in the impedance of the reaction chamber 14a. Therefore, by detecting changes in high frequency electric power caused by changes in impedance, it is possible to know whether or not there is abnormality in the plasma etching system.

In the management system 10 shown in FIG. 5, a plurality of parameters, including the voltage, the current and the phase of high frequency electric power are adopted for operation management of the plasma etching system. To obtain data on those parameters, a detection mechanism 20, including a voltage detector 20a and a current detector 20b, is inserted between the impedance matching box 18 and the electrode 15b.

An electric signal (V) from the voltage detector 20a and an electric signal (I) from a current detector 20b are input to a data converter 20c.

On receiving the two electric signals (V, I), the data converter 20c, as shown in FIG. 6, outputs current values and voltage values and a phase of high frequency output of 13.56 MHz, for example, from the high frequency generator to the computer 22, more specifically, a current value $I_0$ in the fundamental wave component and current values $I_1$, $I_2$, $I_3$, and $I_4$ in the first, second, third and fourth harmonic components, a voltage value $V_0$ in the fundamental wave component and voltage values $V_1$, $V_2$, $V_3$, and $V_4$ in the first, second and third and fourth harmonic components, and the phase Θ respectively at times (Time 1, Time 2 . . . Time n).

FIG. 6 shows a data group to obtain a Mahalanobis space under normal operating condition, which data has been standardized as mentioned above.

In the example of FIG. 6, to standardize data, standard deviations σ of the current values $I_0$, $I_1$, $I_2$, $I_3$ and $I_4$, and the voltage values $V_1$, $V_2$, $V_3$ and $V_4$ and the phase Θ at the measuring times were used. To obtain the averages Ave of those data, two sets of data were used.

As shown in FIG. 6, by sampling data of a plurality of mutually different parameters from a plurality of specimens at the measuring times, and standardizing the data, a group of standardized data, which corresponds to a group of standardized data in FIG. 3(b), can be obtained at the measuring times.

From the groups of standardized data at the measuring times, a correlation matrixR and a Mahalanobis space derived from the correlation matrix R can be generated at the measuring times.

Therefore, as Mahalanobis spaces A are formed previously at the measuring times, the arithmetic operation represented by Eq.(3) for calculating a Mahalanobis distance $D^2$ at measuring times as mentioned above can be executed successively at predetermined times from measured data during the etching process as (current values $I_0$, $I_2$, $I_3$ and $I_4$, voltage values $V_1$, $V_2$, $V_3$ and $V_4$ and phase Θ). Thus, Mahalanobis distances $D_2$ can be obtained at the measuring times.

FIGS. 7 to 11 are graphs showing examples of changes in measured data ($I_0$, $I_2$, $I_3$, $I_4$, $V_1$, $V_2$, $V_3$, $V_4$ and the phase Θ) and changes in the Mahalanobis distance $D_2$ in the second embodiment shown in FIG. 5.

This is a case where abnormality occurred in the operation of the plasma etching system 11 about 90 to 100 sec after the start of the etching process.

Figure 7:
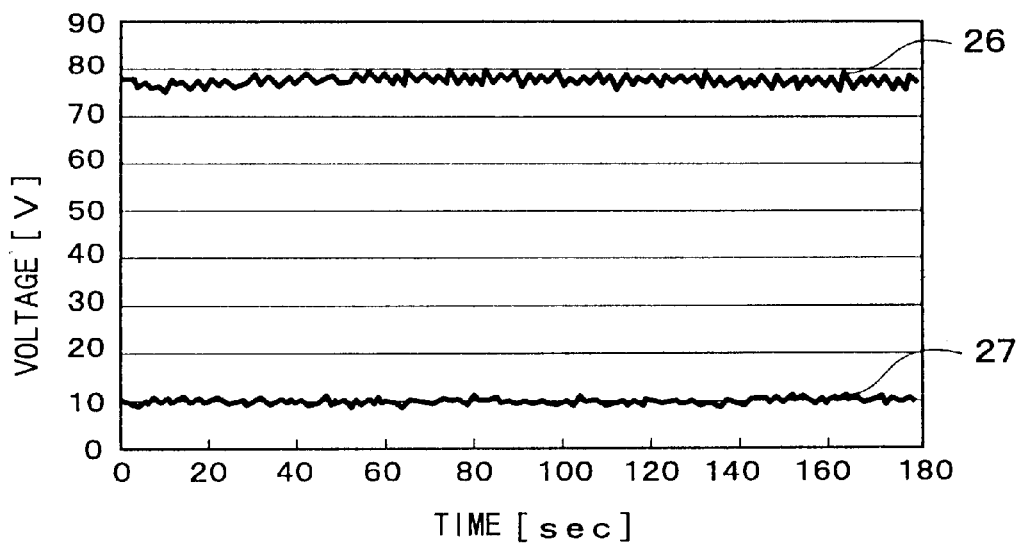
FIG. 7 is a graph (part 1) showing changes in the data group presented in FIG. 6.

The horizontal axis of a graph in FIG. 7 represents time (sec) from the start to the end of etching, and the vertical axis represents voltage values [V]. The characteristic curves 26 and 27 respectively show changes in the voltage value $V_0$ of the fundamental wave component and the voltage value $V_1$ of the first harmonic component of high frequency output from the high frequency generator 16.

In the two characteristic curves 26 and 27, minute voltage changes are observed which are considered to be noise, but in the graph of FIG. 7, there are no notable indications of change other than noise.

Figure 8:
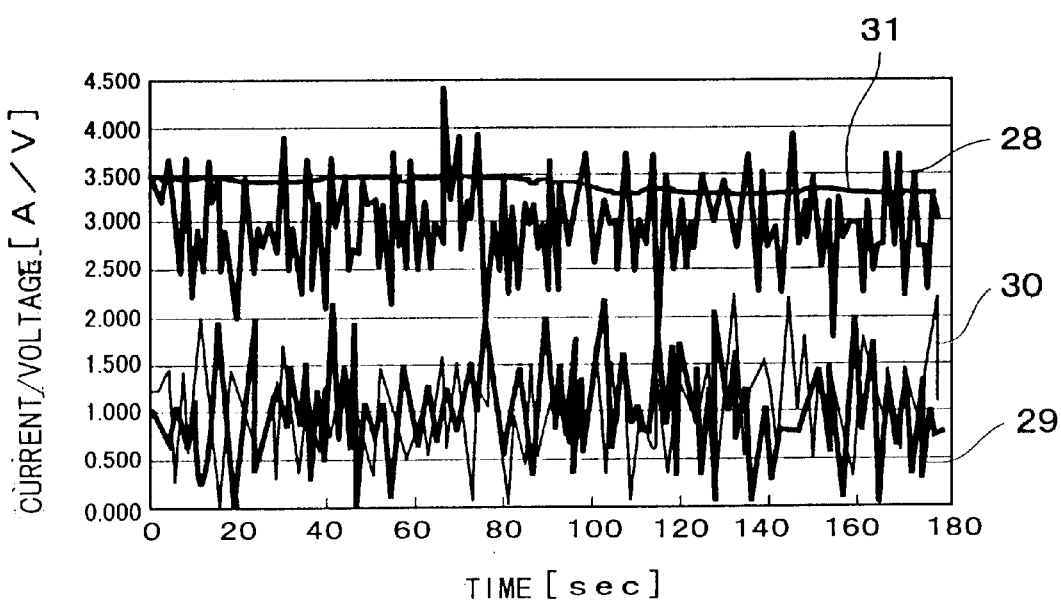
FIG. 8 is a graph (part 2) showing changes in the data group presented in FIG. 6.

In the graph in FIG. 8, the horizontal axis represents time (sec) and the vertical axis represents voltage values (V) or current values (A). The characteristic curves 28, 29 and 30 in FIG. 8 show changes in the voltage values $V_2$, $V_3$ and $V_4$ of the second, third and fourth harmonic components, while the characteristic curve 31 shows the current value $I_0$ of the fundamental wave of the high frequency output.

On the characteristic curves 28 to 30, as with the characteristic curves 26 and 27, there are voltage changes or current changes probably due to noise, but no other changes can be found because of noise.

Figure 9:
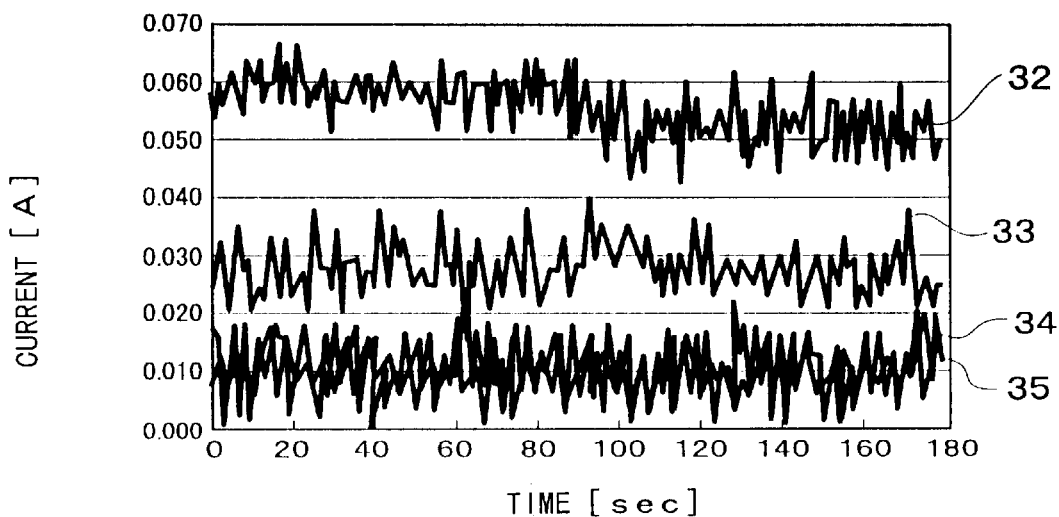
FIG. 9 is a graph (part 3) showing changes in the data group presented in FIG. 6.

In the graph of FIG. 9, the horizontal axis represents time (sec), and the vertical axis represents current values (A). In FIG. 9, the characteristic curves 32 to 35 show changes in the current values $I_1$, $I_2$, $I_3$ and $I_4$ in the first, second, third and fourth harmonic components of the high frequency output.

On the characteristic curve 32, a general sign of change is observed slightly at a point in time about 100 sec from the start of the etching process, but this is not a distinctive change. As with the characteristic curve 32, on the characteristics curves 33 to 35 including noise, changes other than noise can be found.

Figure 10:
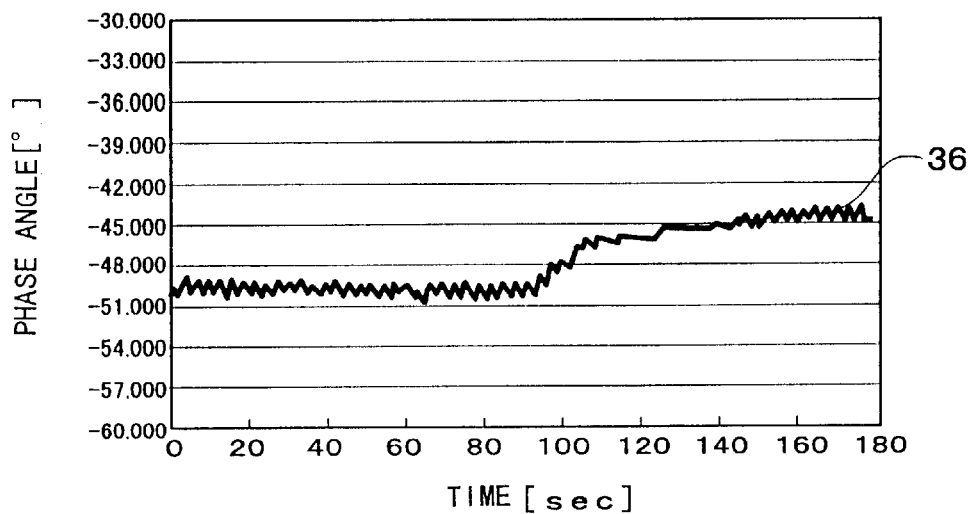
FIG. 10 is a graph (part 4) showing changes in the data group presented in FIG. 6.

Meanwhile, in the graph in FIG. 10, in which the horizontal axis represents time (sec) and the vertical axis represents phase angles (degrees), as is clear from changes of the characteristic curve 36 showing changes in phase, though noise is included in the characteristic curve 36, a distinctive change in phase angle can be observed.

However, as is apparent from the graph of FIG. 10, because the phase variation is no more than a phase change of 5° from about −50° to about −45°, so that a large S/N ratio cannot be obtained.

Figure 11:
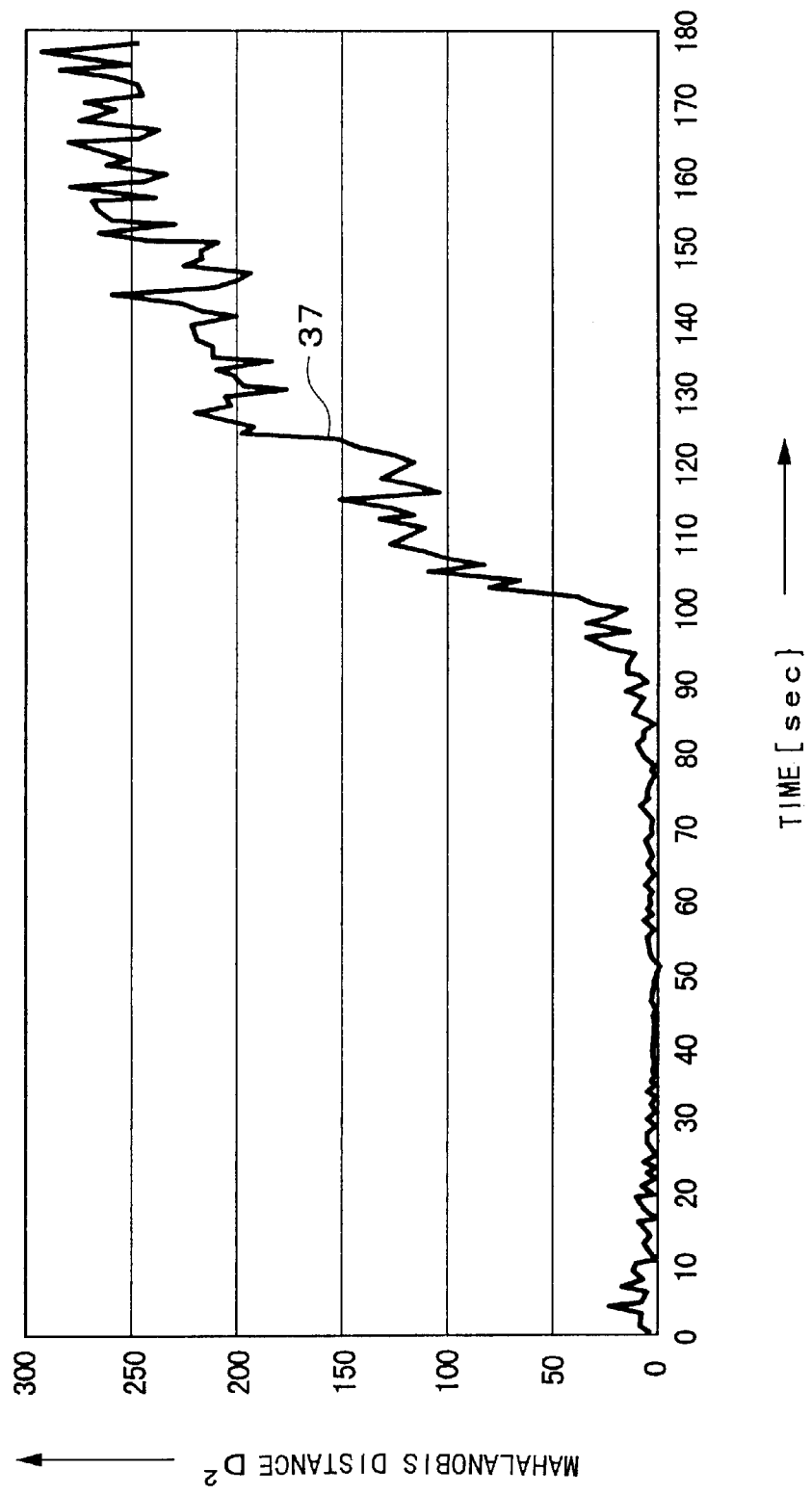
FIG. 11 is a graph showing changes in Mahalanobis distance obtained by the management system in FIG. 5.
Figure 12:
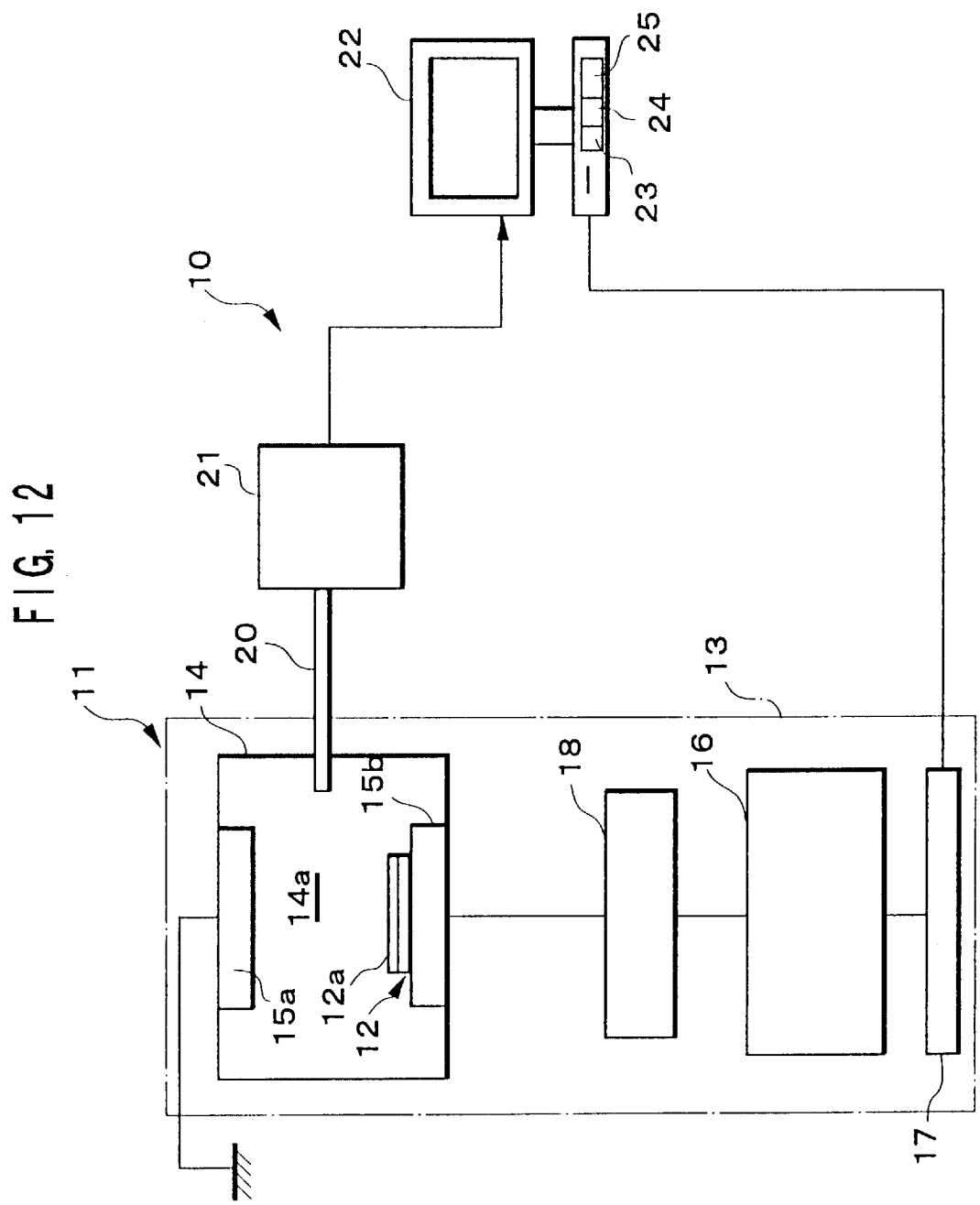
FIG. 12 is a diagram, like in FIG. 1, schematically showing another example of the management system of semiconductor manufacturing equipment according to the present invention.

In contrast, in the graph showing changes in Mahalanobis distance $D^2$ in FIG. 11, a very large change can be observed clearly in the curve of Mahalanobis distance $D^2$.

In FIG. 11, the horizontal axis represents time (sec), and the vertical axis represents the Mahalanobis distance $D^2$.

The characteristic curve 37 was obtained by plotting at the measuring times a Mahalanobis distance $D^2$ calculated on the basis of Mahalanobis spaces A formed at the measuring times and from measured data ($I_0$, $I_1$, $I_2$, $I_3$, $V_1$, $V_2$, $V_3$, $V_4$ and the phase Θ) obtained at the measuring times from the start to the end of the etching process.

Viewed by micro analysis, the characteristic curve 37 includes a noise component same as with the characteristic curves 26 to 36 mentioned above. However, a very large change greater than changes owing to the noise component is observed at a point about 100 sec on the time base.

More specifically, on the graph of FIG. 11, the characteristic curve 37 shows that the Mahalanobis distance $D^2$ stays at a value close to about zero (precisely 1) for some time, but rises sharply towards levels of about 250.

Therefore, by setting a threshold value for the Mahalanobis distance $D^2$ showing an abnormal value at 250, for example, it becomes possible to detect an abnormal condition by variations about 250 times greater than those during normal operating condition. Compared with a case where an abnormal operating condition is detected only by changes in phase as mentioned above, an abnormal operating condition can be detected with a very high S/N ratio.

The above-mentioned threshold value for the Mahalanobis distance $D^2$ can be selected at one's discretion, for example, it may be set at a value of 1 or 50. Even if the threshold value is set at either of those values, a malfunction of the plasma etching system 11 can be detected accurately with a higher S/N ratio than in abnormality detection only by phase.

According to the management system 10 in the second embodiment, as mentioned above, a decision can be made whether or not the Mahalanobis distance $D^2$ is greater than a predetermined value at each of the data measuring times. By this arrangement, if abnormality occurs during etching of a semiconductor substrate 12, it can be detected at the moment.

Accordingly, in response to abnormality detection, an alarm can be issued or the plasma etching system 11 can be stopped immediately to take a quick action.

Also in the second embodiment, by having Mahalanobis distances and spaces prepared previously under mutually different conditions, in each of which one parameter is intentionally set at an abnormal value and the other parameters are set at normal values, the Mahalanobis distances and spaces can be used to deduce an abnormal parameter like in the example described when the first embodiment was referred to.

<Embodiment 3>

In the management system 10, rays of a plurality of wavelengths from emission of plasma in the reaction chamber 14a of the plasma etching system 11 are used as mutually different parameters, and the intensity of rays of different wavelengths are sampled as data.

As detection means 20 for obtaining data on a plurality of desired mutually different wavelengths from plasma emission in the reaction chamber 14a, an optical fiber 20 is provided which guides the rays from plasma in the reaction chamber 14a to the outside of the plasma etching system 11. The plasma light led out through the optical fiber 20 is guided to the emission spectrometer 21. The emission spectrometer 21 outputs intensity peak values of the desired wavelengths together with data on the wavelengths to the arithmetic circuit 24.

FIG. 13 shows a data group for generating a Mahalanobis space under normal operating condition, sampled by the emission spectrometer 21. Presented in FIG. 13 is a data group that has been standardized by the same standardizing process as mentioned above.

AS has been described referring to the second embodiment, in FIG. 13 the data of a plurality of mutually different parameters was obtained from a plurality of specimens. A group of standardized data can be obtained, which corresponds to the standardized data separately sampled at the measuring times in FIG. 3(b).

Therefore, from standardized data sampled at the measuring times, a correlation matrix R and a Mahalanobis space. A derived from the correlation atrix R as shown in FIG. 4 can be generated at the respective data measuring times as in the second embodiment.

Figure 14:
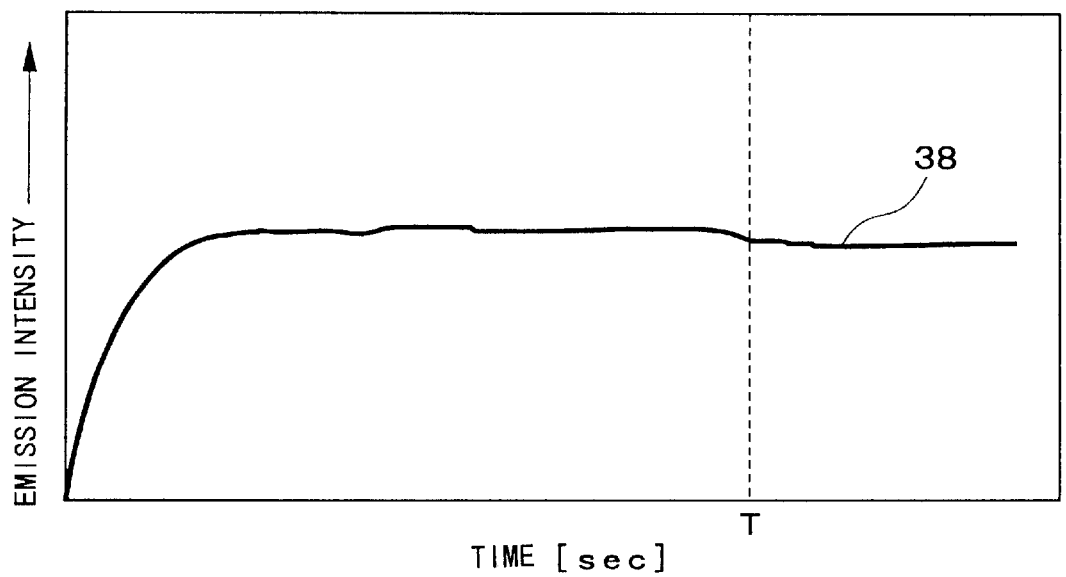
FIG. 14 is a graph showing an example of a conventional EPD waveform in semiconductor manufacturing equipment in FIG. 3.

FIG. 14 is a graph showing changes in the intensity of the emission peak value of one wavelength, plotted by the conventional method, in which the horizontal axis represents the lapsed time from the start of etching and the vertical axis represents the emission intensity.

FIG. 14 shows a case where abnormality occurred in the operation of the plasma etching system 11 at time T from the start of the etching process. On the characteristic curve 38 showing changes in the intensity of the emission peak value only, no distinctive change can be seen around time T.

Figure 15:
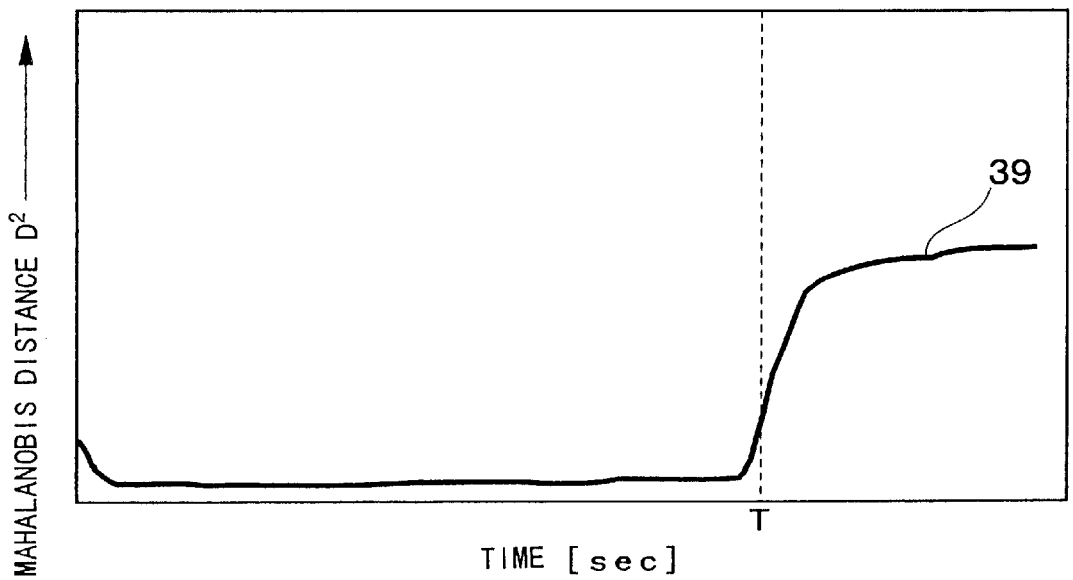
FIG. 15 is a graph showing changes in Mahalanobis distance obtained by the management system of semiconductor manufacturing equipment in FIG. 13.

On the other hand, the graph in FIG. 15 shows the relation between time in the above-mentioned case where abnormality occurred at time T and the Mahalanobis distance $D^2$. The characteristic curve 39 shows changes in the Mahalanobis distance $D^2$ when peak values were sampled for wavelengths $\lambda 1, \lambda 2 \ldots \lambda 11$, Mahalanobis spaces were generated at the measuring times, derived from standardized data at the measuring times, and Mahalanobis distances $D^2$ were generated at the measuring times from measured data in the case where abnormality occurred at time T.

The characteristic curve 39 clearly shows a change in the Mahalanobis distance D2 at about time T that reveals a notable change, which could not be observed on the characteristic curve 38 that only shows the emission intensity the graph in FIG. 15.

Therefore, the management system in the third embodiment is capable of detecting an infinitesimal change in plasma in the reaction chamber 14a of the plasma etching system 11, which cannot be detected only from a change in emission intensity. Therefore, it becomes possible to manage the operation of the plasma etching system 11 with high accuracy.

The foregoing description has been made using an optical parameter related to plasma emission or electrical parameters, such as voltage, current and phase of high frequency electric power in order to manage the operation of the plasma etching system.

The present invention of this patent application is not limited to them, it is possible to adopt various system parameters representing the operating condition of the plasma etching system, such as gas pressure, APC, or the like of the reaction chamber of the plasma etching system by using a detector, such as a mass spectrograph.

Besides the above-mentioned management of the plasma etching system, the management method according to the present invention can be applied to management of other semiconductor manufacturing equipment.

According to the management method of the present invention, as mentioned above, a plurality of data of a data group are not handled independently, but handled in data groups, and a decision is made whether the semiconductor manufacturing equipment is operating normally or not on the basis of a Mahalanobis space which takes correlation between data into consideration. Therefore, it is possible to manage the operating condition of the semiconductor manufacturing equipment with high accuracy unobtainable with the conventional interlock system which does not consider correlation between data.

According to the management system of the present invention, as described above, the arithmetic circuit calculates a Mahalanobis distance from parameter values obtained by the detection mechanism on the basis of a Mahalanobis space stored in the memory unit, and the decision circuit decides whether or not the calculated Mahalanobis distance exceeds a predetermined value. Therefore, the method according to the present invention can be put into quick and effective use, so that the operation of the semiconductor manufacturing equipment can be managed with a system of relatively simple configuration.

What is claimed is:

1. A method of managing operation of semiconductor manufacturing equipment comprising:

sampling a plurality of data of at least one parameter under a normal operating condition of said semiconductor manufacturing equipment;

generating a Mahalanobis space based on a group of sampled data;

calculating, based on said Mahalanobis space, a Mahalanobis distance from a group of measured values of said at least one parameter under an actual operating condition of said semiconductor manufacturing equipment; and when a calculated Mahalanobis distance exceeds a predetermined value, making a decision that a malfunction occurred in said semiconductor manufacturing equipment.

2. A management method according to claim 1, further comprising:

sampling a plurality of data under abnormal conditions, each abnormal condition being generated by setting one parameter at an abnormal value and others of said at least one parameter at normal values;

generating Mahalanobis spaces under said abnormal conditions;

when, from a value of said Mahalanobis distance, a decision has been made that a malfunction occurred, calculating Mahalanobis distances corresponding to Mahalanobis spaces from said measured values, based on said Mahalanobis space under the abnormal condition; and estimating that among said plurality of parameters, abnormality occurred in a parameter that gave a Mahalanobis space that has a Mahalanobis distance closest to 1.

3. A management method according to claim 1, wherein said sampling comprises sampling a plurality of mutually different parameters that include said at least one parameter, said management method further comprising:

generating Mahalanobis spaces at predetermined times from a data group of said plurality of mutually different parameters measured at predetermined times; and calculating Mahalanobis distances at predetermined times from a group of measured values of said plurality of mutually different parameters, obtained from the actual operating condition of said semiconductor manufacturing equipment, by using said Mahalanobis spaces formed at predetermined times.

4. A management system of semiconductor manufacturing equipment comprising:

a memory unit that stores data on a Mahalanobis space obtained from a parameter showing a normal operating condition of semiconductor manufacturing equipment;

a detection mechanism that obtains data values of said parameter from said semiconductor manufacturing equipment during operation;

an arithmetic circuit that calculates a Mahalanobis distance from a data group of said parameter, obtained by said detection mechanism by using said Mahalanobis space stored in said memory unit; and a circuit that decides whether or not a calculated value of said Mahalanobis distance by said arithmetic circuit exceeds a predetermined value, to determine occurrence of a malfunction of said semiconductor manufacturing equipment.

5. A management system according to claim 4, wherein said semiconductor manufacturing equipment is a plasma etching system utilizing plasma emission, and wherein said detection mechanism is a plasma emission intensity detector for measuring the intensity of a desired wavelength of the plasma emission of said etching system.

6. A management system according to claim 4, wherein said semiconductor manufacturing equipment is a plasma etching system equipped with a high frequency oscillator for plasma emission, and wherein said detection mechanism includes a current detector and a voltage detector for obtaining a current value, a voltage value, and a phase of high frequency output of said high frequency oscillator.

7. A management system according to claim 6, wherein said detection mechanism further includes a data converter for calculating current values, voltage values and phases of a fundamental wave and harmonics of said high frequency output, from a current value and a voltage value detected by said current detector and said voltage detector.

8. A management system according to claim 4, wherein said semiconductor manufacturing equipment is a plasma etching system utilizing plasma emission, and wherein said detection mechanism further includes an emission spectrometer for measuring the intensity of a plurality of desired wavelengths of plasma emission of said etching system.

* * * * *